US008564288B2

(12) United States Patent
Jannin et al.

(10) Patent No.: US 8,564,288 B2
(45) Date of Patent: Oct. 22, 2013

(54) METHOD FOR NMR SPECTROSCOPY OR MRI MEASUREMENTS USING DISSOLUTION DYNAMIC NUCLEAR POLARIZATION (DNP) WITH SCAVENGING OF FREE RADICALS

(75) Inventors: Sami Jannin, Lausanne (CH); Pascal Mieville, Genève (CH); Geoffrey Bodenhausen, Paris (FR)

(73) Assignees: Bruker BioSpin AG, Faellanden (CH); Ecole Polytechniqve Fédérale de Lausanne (EDFL), Lausanne (CH)

( * ) Notice: Subject to any disclaimer, the term of this patent is extended or adjusted under 35 U.S.C. 154(b) by 407 days.

(21) Appl. No.: 12/929,264

(22) Filed: Jan. 12, 2011

(65) Prior Publication Data
US 2011/0175611 A1 Jul. 21, 2011

(30) Foreign Application Priority Data

Jan. 18, 2010 (EP) .................................. 10150983

(51) Int. Cl.
*G01V 3/00* (2006.01)
(52) U.S. Cl.
USPC ........................................ 324/307; 600/420
(58) Field of Classification Search
USPC .................. 324/307, 309, 312, 300; 600/420
See application file for complete search history.

(56) References Cited

U.S. PATENT DOCUMENTS

| 2006/0173282 | A1 | 8/2006 | Ardenkjaer | |
|---|---|---|---|---|
| 2007/0025918 | A1 | 2/2007 | Hurd | |
| 2008/0260649 | A1 | 10/2008 | Thaning | |
| 2009/0121712 | A1 | 5/2009 | Han | |
| 2011/0150706 | A1* | 6/2011 | Murphy et al. | 422/105 |
| 2012/0286782 | A1* | 11/2012 | Jannin et al. | 324/309 |
| 2013/0096420 | A1* | 4/2013 | Aime et al. | 600/420 |

FOREIGN PATENT DOCUMENTS

WO 2008/149118 12/2008

OTHER PUBLICATIONS

Ardenkjaer-Larsen, J.H. et al. "Increase in signal-to-noise ratio of >10,000 times in liquid-state NMR", Proceedings of the National Academy of Sciences of the United States (PNAS), National Academy of Science, US LNKD—DOI:10.1073/PNAS.1733835100, vol. 100, No. 18, Sep. 2, 2003, pp. 10158-10163.

Day, et al. "Applications of DNP-NMR for the measurement of heteronuclear T1 relaxation times", Journal of Magnetic Resonance, Academic Press, Orlando, FL, US LNKD-DOI:10.1016/J.JMR.2007.04.015, vol. 187, No. 2, Jul. 18, 2007, pp. 216-224.

(Continued)

*Primary Examiner* — Louis Arana
(74) *Attorney, Agent, or Firm* — Paul Vincent (57) ABSTRACT

A method for sample preparation for magnetic resonance measurements using Hyperpolarization by Dissolution Dynamic Nuclear Polarization, involves preparation of frozen beads of a first kind containing paramagnetic substances in addition to the solute under investigation; insertion of the frozen beads into a polarizing magnet; creation of enhanced polarization of nuclei in a magnetic field; heating of the sample to room temperature; transfer of the sample to an MR magnet; and carrying out an MR measurement. In addition, frozen beads of a second kind containing a reducing agent are prepared and inserted into the polarization magnet together with the frozen beads of the first kind. By this method, longitudinal and transverse relaxation times in NMR are extended and free radicals in hyperpolarized solutions are eliminated.

14 Claims, 5 Drawing Sheets

(56) References Cited

OTHER PUBLICATIONS

Dollmann, B. et al. "Development of a Polarizer and Biocompatible Polarizing Agents for Use in Dynamic Nuclear Polarization (DNP)—Enhanced NMR and MRI", World Congress on Medical Physics and Biomedical Engineering, Sep. 7-12, 2009, Munich, Germany (Book Series:IFMBE Proceedings), vol. 25/2, Sep. 7, 2009, pp. 587-589.

Kurdzesau, F. et al. "Dynamic nuclear polarization of small labelled molecules in frozen water-alcohol solutions; DNP of small solutions", Journal of Physics D. Applied Physics, IOP Publishing, Bristol, GB, vol. 41, No. 15, Aug. 7, 2008, p. 155506.

Carravetta, M.; Johannessen, O.G.; Levitt, M.H. "Beyond the T1 Limit: Singlet Nuclear Spin States in Low Magnetic Fields", Phys. Rev. Lett. 2004, 92, 153003-15333007.

Pileio, G.; Carravetta, M.; Levitt, M.H. "Extremely Low-Frequency Spectroscopy in Low-Field Neclear Magnetic Resonance", Phys. Rev. Lett. 2009, 103, 083002.

Warren, J.J.; Mayer, J.M. "Surprisingly Long-Lived Ascorbyl Radicals in Acetonitrile: Concerted Proton-Electron Transfer Reactions and Thermochemistry", Am. Chem. Coc. 2008, 130, 7546-7547.

Bielski, B.H.J.; Allen, A.O.; Schwarz, H.A. "Mechanism of Disproportionation of Ascorbate Radicals", J. Am. Chem. Soc. 1981, 103, 3516-3518.

\* cited by examiner

METHOD FOR NMR SPECTROSCOPY OR MRI MEASUREMENTS USING DISSOLUTION DYNAMIC NUCLEAR POLARIZATION (DNP) WITH SCAVENGING OF FREE RADICALS

This application claims Paris Convention priority of EP 10 150 983.4 filed Jan. 18, 2010 the complete disclosure of which is hereby incorporated by reference.

BACKGROUND OF THE INVENTION

The invention concerns a method for sample preparation for magnetic resonance (=MR) measurements using Hyperpolarization by Dissolution Dynamic Nuclear Polarization, comprising:

1.1) preparation of frozen beads of a first kind containing paramagnetic substances, in particular radicals, in addition to the solute under investigation with suitable, in particular glass-forming solvents;
2.1) insertion of the frozen beads into a polarizing magnet;
3.1) creation of enhanced polarization of nuclei within the sample in a magnetic field at cryogenic temperatures;
4.1) heating of the sample to room temperature;
5.1) transfer of the polarized sample from the polarizing magnet to an MR magnet;
6.1) carrying out an MR measurement. A method as described above is known from US 2006/0173282 A1 and GB 0711048.9.

Dynamic nuclear polarization (DNP) can enhance the nuclear polarization, i.e., the difference between the populations of the Zeeman levels /α> and /β3> of a spin I=½, by up to four orders of magnitude with respect to the Boltzmann distribution at room temperature (Abragam, A.; Goldman, M. *Rep. Prog. Phys.* 1978, 41, 395-467).

The enhancement of the nuclear spin polarization arises from thermal mixing, which is brought about by microwave saturation of the EPR transitions of stable radicals that must be mixed with the sample under investigation before freezing.

In dissolution-DNP, the sample is usually polarized at low temperatures and moderate magnetic fields (T=1.2 K and $B_0$=3.35 or 5 T in our laboratory) (Comment, A.; van den Brandt, B.; Uffmann, K.; Kurdzesau, F.; Jannin, S.; Konter, J. A.; Hautle, P.; Wenckebach, W. T. H.; Gruetter, R.; van der Klink, J. J. *Concepts Magn. Reson. B* 2007, 31B, 255-269; Comment, A.; van den Brandt, B.; Uffmann, K.; Kurdzesau, F.; Jannin, S.; Konter, J. A.; Hautle, P.; Wenckebach, W. T.; Gruetter, R.; van der Klink, J. J. *Appl. Magn. Reson.* 2008, 34, 313-319; Jannin, S.; Comment, A.; Kurdzesau, F.; Konter, J. A.; Hautle, P.; van den Brandt, B.; van der Klink, J. J. *J. Chem. Phys.* 2008, 128, 241102) and rapidly dissolved (Ardenkjaer-Larsen, J. H.; Fridlund, B.; Gram, A.; Hansson, G.; Hansson, L.; Lerche, M. H.; Servin, R.; Thaning, M.; Golman, K. *P Natl Acad Sci USA* 2003, 100, 10158-10163) and heated to ambient temperature by a burst of water vapor. To minimize losses of nuclear spin polarization, the transfer from the polarizer to the NMR spectrometer or MRI magnet, including the settling of mechanical vibrations and convection currents, and, if required, the infusion into living organisms, must be completed within an interval T<$T_1$. In our laboratory, the interval T has recently been reduced to 4.5 s.

The radicals in the hyperpolarized solution lead to an increase of the longitudinal relaxation rate $R_1$=1/$T_1$ of the solute, thus limiting the time scales of the dynamic processes that can be monitored with hyperpolarized nuclei. A concomitant enhancement of the transverse relaxation rates $R_2$=1/$T_2$ leads to undesirable line-broadening. The relaxation rates $R_{LLS}$=1/$T_{LLS}$ of the populations of long-lived states (LLS) (Carravetta, M.; Johannessen, O. G.; Levitt, M. H. *Phys. Rev. Lett.* 2004, 92, 153003-153007; Carravetta, M.; Levitt, M. H. *J. Chem. Phys.* 2005, 122, 214505; Pileio, G.; Levitt, M. H. *J. Chem. Phys.* 2009, 130, 214501; Sarkar, R.; Vasos, P. R.; Bodenhausen, G. *J. Am. Chem. Soc.* 2007, 129, 328-334) and the decay rates $R_{LLC}$=1/$T_{LLC}$ of long-lived coherences (LLC) are even more sensitive to the presence of free radicals than populations of eigenstates and single-quantum coherences.

Free radicals tend to be toxic and hyperpolarized solutions should not be infused into living organisms unless the radicals have been eliminated.

Object of the invention is to extend longitudinal and transverse relaxation times in NMR and at the same time eliminate free radicals from hyperpolarized solutions.

SUMMARY OF THE INVENTION

This object is achieved by a method according to the independent claim. The preparation of the inventive method comprises the following steps additional to the above mentioned preparation:

1.2) preparation of frozen beads of a second kind containing a reducing agent dissolved in a solvent;
2.2) insertion of the frozen beads of the second kind into the polarization magnet together with the frozen beads of the first kind After preparation of frozen beads of a first kind, which contain free radicals in addition to the solute under investigation with suitable, in particular glass-forming solvents, a second kind of frozen beads is prepared, containing a reducing agent in a suitable solvent. These frozen beads of the second kind are inserted together with the frozen beads of the first kind into the polarization magnet in equal masses. By varying the concentration of the solutions the molar relation between free radicals and reducing agent can be changed.

During the dissolution process, all beads melt rapidly and the two solutions become intimately mixed, so that the radicals are reduced by the reducing agent during their voyage from the polarizing magnet to the NMR spectrometer or MRI magnet. It has been demonstrated in lab tests that the addition of a reducing agent can significantly extend the lifetime sof long-lived states (LLS) and long-lived coherences (LLC). In summary, it is possible to quench paramagnetic relaxation due to the stable radicals required for dissolution DNP by mixing the frozen beads containing the substance under investigation and the stable radicals with frozen beads containing a reducing agent.

A preferred variation of the inventive method is characterized in that the concentration of the reducing agent in the beads of the second kind is higher than the concentration of the paramagnetic substances in the beads of the first kind, preferably a factor between 2 and 100.

In a lab test a second-order rate constant $k_2$=0.201±0.005 $s^{-1} \cdot M^{-1}$ was determined with 2.5 mM of a paramagnetic substance and 30 mM of a reducing agent. Because of the excess of the reducing agent, the reduction can be described by a pseudo-first-order rate constant $k_1$=0.0060±0.0002 $s^{-1}$.

Preferably the reducing agent is sodium ascorbate. It has been demonstrated in test that sodium ascorbate is very effective in reducing free radicals.

Very much preferred is a variation of the inventive method, characterized in that the reducing agent is dissolved in water, in particular deuterated water ($D_2O$). In tests this solvent has proven to be very advantageous.

Another preferred variation of the inventive method is characterized in that the paramagnetic substances radicals in the beads of the first kind contain nitroxyl radicals. Nitroxyl radicals are widely used for DNP at low temperatures.

Preferably the paramagnetic substances in the beads of the first kind comprise 4-hydroxy-2,2,6,6-tetramethypiperidine-1-oxyl (=TEMPOL). TEMPOL is the most common nitroxyl radical.

An advantageous variant of the inventive method is characterized in that the solvent of the frozen beads of a first kind is a mixture of glycerol and water. At low temperatures this solvent forms glass-like solid droplets.

It is advantageous if the beads of the first kind and of the second kind are inserted into the polarization magnet in equal masses. It is much easier to use defined concentrations for the solutions containing either the radicals or the reducing agent than to use equal concentrations and calculate the needed number of beads in order to get a certain molar relation between the radicals and the reducing agent.

In a preferred variant of the inventive method the creation of enhanced polarization of nuclei within the sample in a magnetic field at cryogenic temperatures in step 5.1) is performed by microwave irradiation.

It is advantageous if the MR measurement in step 6.1) is carried out in a nuclear magnetic resonance (=NMR) spectrometer or in a magnetic resonance imaging (MRI) apparatus, in particular in a tomograph. These instruments are particularly well suited for measurements of long-lived states (LLS) and long-lived coherences (LLC). Also these instruments are suited for the investigation of living objects.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

The invention is shown in the drawing:

DESCRIPTION OF THE PREFERRED EMBODIMENT

Figure 1A:
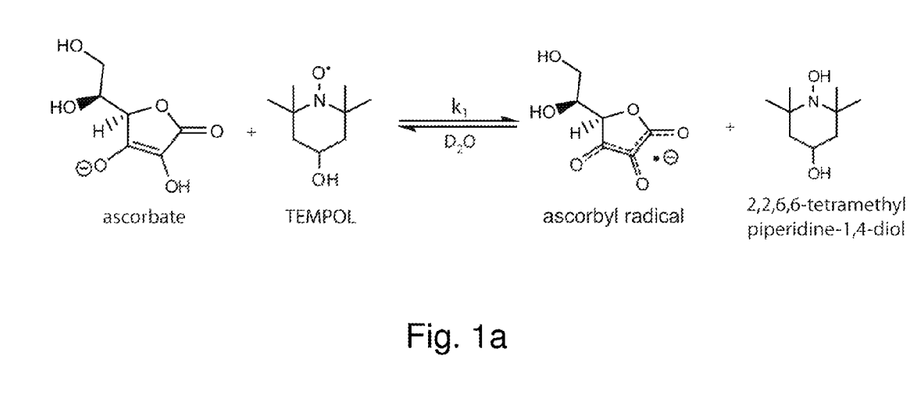
FIG. 1a The reductive reaction of TEMPOL by sodium ascorbate leads to the formation of a delocalized sodium ascorbyl radical and diamagnetic TEMPOHL.

In laboratory tests it was observed how nitroxide radicals such as 4-hydroxy-2,2,6,6-tetramethylpiperidine-1-oxyl (TEMPOL) that are widely used for DNP at low temperatures can be reduced by scavengers like sodium ascorbate (vitamin C) during the dissolution process (FIG. 1a) into 2,2,6,6-tetramethylpiperidine-1,4-diol (TEMPOHL), thus extending transverse and longitudinal relaxation times of solutes.

The frozen beads that contain 30 mM TEMPOL in addition to the solute under investigation (in laboratory tests, acrylic acid, choline and acetylcholine (Sarkar, R.; Comment, A.; Vasos, P. R.; Jannin, S.; Gruetter, R.; Bodenhausen, G.; Hall, H.; Kirik, D.; Denisov, V. P. *J. Am. Chem. Soc.* 2009, 131, 16014-16015), alanine-glycine (Vasos, P. R.; Comment, A.; Sarkar, R.; Ahuja, P.; Jannin, S.; Ansermet, J. P.; Konter, J. A.; Hautle, P.; van den Brandt, B.; Bodenhausen, G. *P. Natl. Acad. Sci. USA* 2009, 106, 18475-18479), ubiquitin (Sarkar, R.; Ahuja, P.; Vasos, P. R.; Bodenhausen, G. *Chem. Phys. Chem.* 2008, 9, 2414-2419), lithium-6 (van Heeswijk, R. B.; Uffmann, K.; Comment, A.; Kurdzesau, F.; Perazzolo, C.; Cudalbu, C.; Jannin, S.; Konter, J. A.; Hautle, P.; van den Brandt, B.; Navon, G.; van der Klink, J. J.; Gruetter, R. *Magn. Reson. Med.* 2009, 61, 1489-1493), xenon-129, yttrium-89, etc. were studied) with glass-forming solvents such as glycerol/water mixtures are inserted in the polarizer together with a roughly equal number of frozen beads that contain 3 M sodium ascorbate in $D_2O$.

Figure 1B:
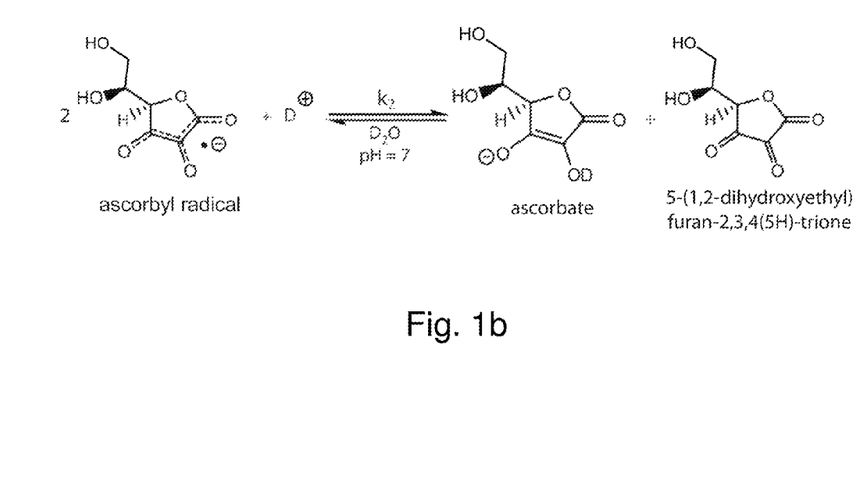
FIG. 1b Disproportionation of ascorbyl radicals into ascorbate and diamagnetic 5-(1,2-dihydroxyethyl)furan-2,3,4 (5H)-trione.
Figure 1C:
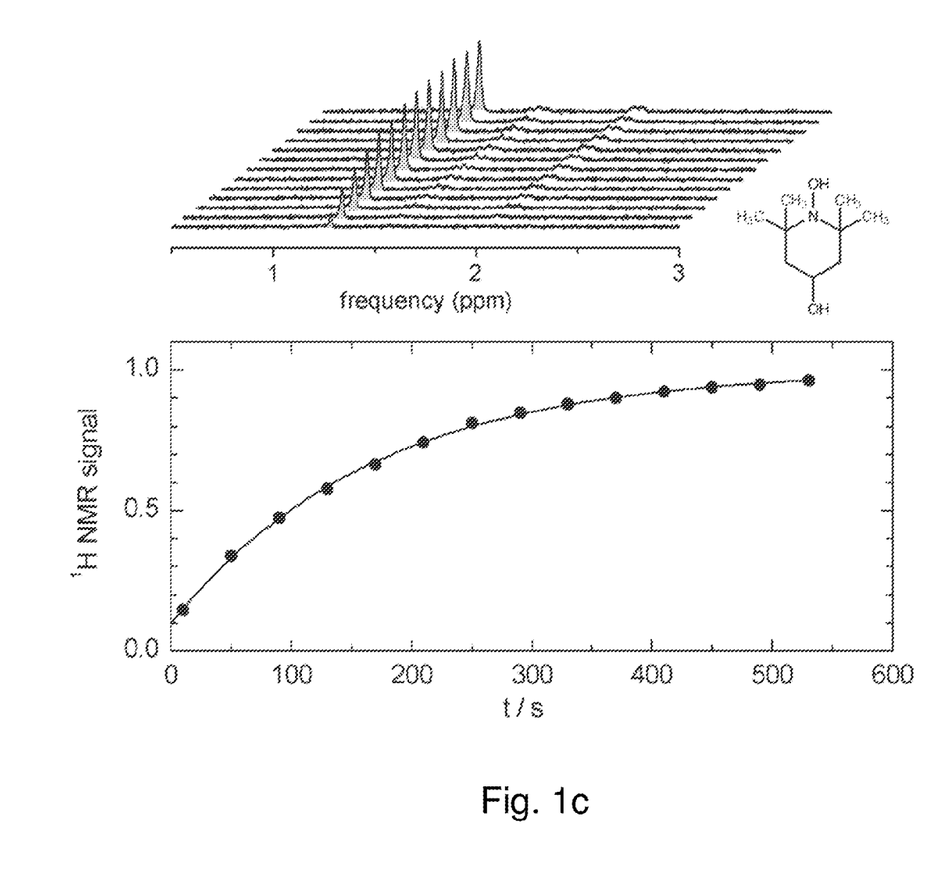
FIG. 1c Reaction of 2.5 mM TEMPOL with 30 mM sodium ascorbate in $D_2O$ without DNP at T=296 K in a magnetic field $B_0$=7.05 T (300 MHz for protons). The singlet due to the four degenerate methyl groups in the diamagnetic TEMPOHL (black circles) appears only after reduction of the paramagnetic TEMPOL. A mono-exponential fit (black line) gives a pseudo-first-order rate constant $k_1$=0.0060±0.0002 $s^{-1}$ for the reduction process.

During the dissolution process, all beads melt rapidly and the two solutions become intimately mixed, so that the TEMPOL radicals are reduced by the sodium ascorbate during their voyage from the polarizing magnet to the NMR spectrometer or MRI magnet. The kinetics of this reduction process can be studied at room temperature (FIG. 1c) by NMR or ESR (Bardelang, D.; Banaszak, K.; Karoui, H.; Antal, R.; Waite, M.; Udachin, K.; Ripmeester, J. A.; Ratcliffe, C. I.; Ouari, O.; Tordo, P. *J. Am. Chem. Soc.* 2009, 131, 5402-5404). In laboratory test the growth of the proton signal due to the four degenerate methyl groups of TEMPOHL arising from the reduction of TEMPOL by ascorbate were observed. A second-order rate constant $k_2=0.201\pm0.005$ s$^{-1}$·M$^{-1}$ was determined with 2.5 mM TEMPOL and 30 mM sodium ascorbate. Because of the excess of sodium ascorbate, the reduction can be described by a pseudo-first-order rate constant $k_1=0.0060\pm0.0002$ s$^{-1}$.

The scavenging of TEMPOL by ascorbate gives rise to delocalized ascorbyl radicals, which have been studied in solvents such as acetonitrile (Warren, J. J.; Mayer, J. M. *J. Am. Chem. Soc.* 2008, 130, 7546-7547). In the presence of a proton-donating solvent, as in the water/glycerol or water/ethanol mixtures typically used in dissolution-DNP, ascorbyl radicals quickly disproportionate ($k_2\sim3\times10^5$ s$^{-1}$·M$^{-1}$) (Bielski, B. H. J.; Allen, A. O.; Schwarz, H. A. *J. Am. Chem. Soc.* 1981, 103, 3516-3518)(FIG. 1b) in parallel to the scavenging process, resulting in solutions that do not contain any paramagnetic radicals.

Figure 2A:
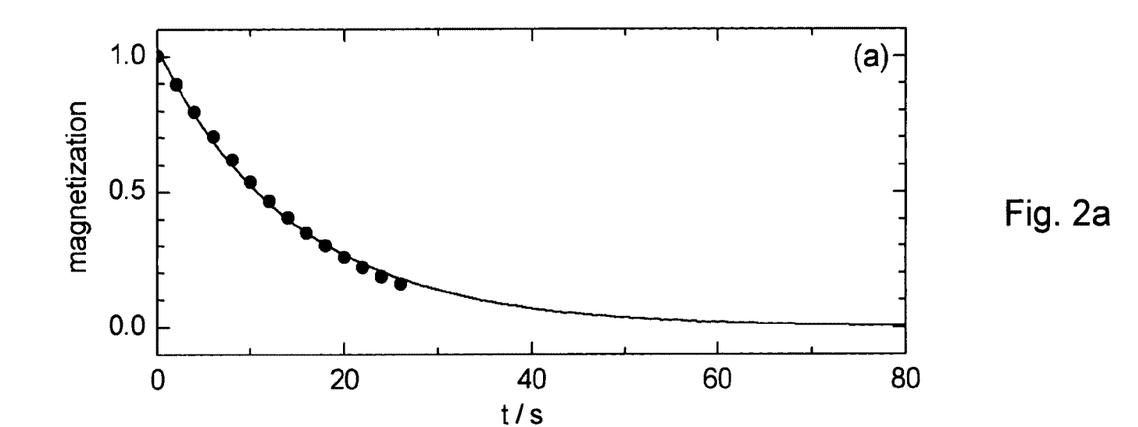
FIG. 2a Decay of the hyperpolarized magnetization of proton $H^R$ ($T_1$=14.79±0.27 s) in acrylic acid ($CH_2$=$CH^R COOH$), measured 4.5 s after dissolution with hot $D_2O$ of a mixture of frozen beads of acrylic acid containing TEMPOL and frozen beads of 3 M sodium ascorbate (vitamin C).
Figure 2B:
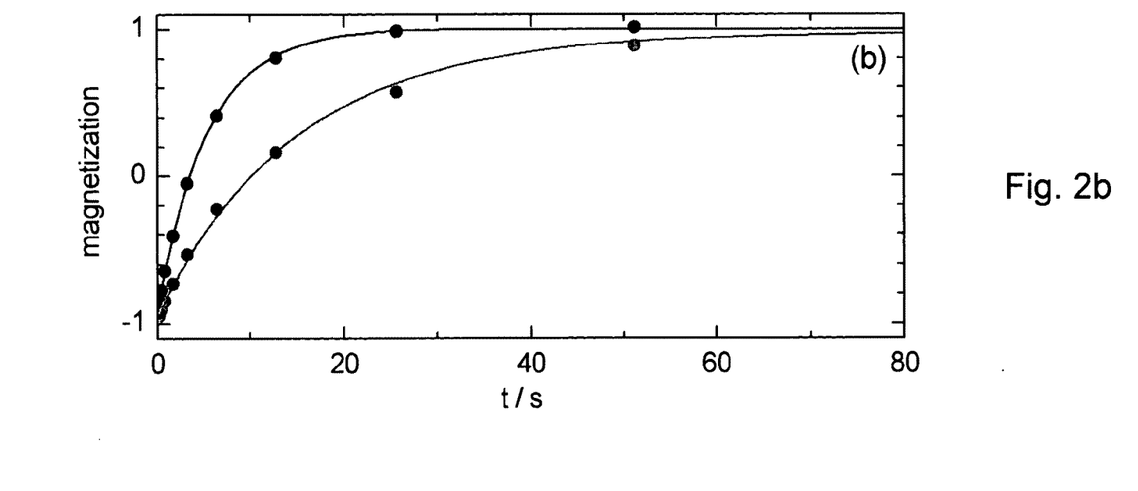
FIG. 2b Inversion-recovery without DNP of proton $H^R$ in acrylic acid in $D_2O$ with 2.5 mM TEMPOL without scavenger (black circles, $T_1$=5.35±0.1 s) and after addition of 30 mM sodium ascorbate (grey circles, $T_1$=14.9±0.8 s).

FIG. 2b shows how the scavenging of TEMPOL by sodium ascorbate leads to a nearly three-fold extension of the longitudinal relaxation time of the most isolated proton H$^R$ in acrylic acid (CH$_2$=CH$^R$COOH), which has the longest lifetime $T_1$.

Figure 3A:
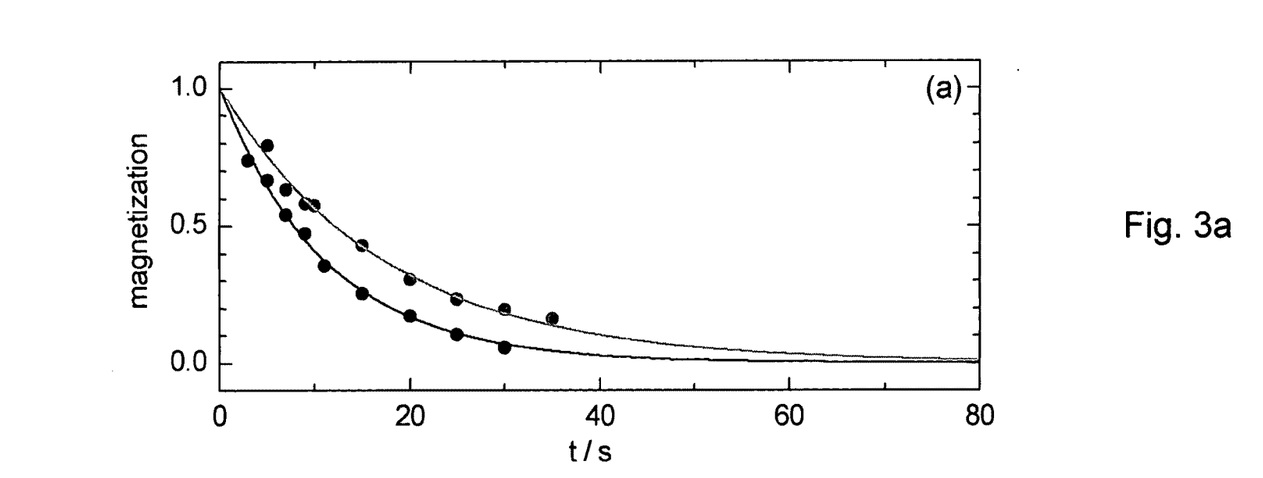
FIG. 3a Decay of long-lived states (LLS) involving the two protons $H^I$ and $H^S$ in acrylic acid ($CH^I H^S$=CHCOOH) at T=296 K and $B_0$=7.05 T (300 MHz). In the absence of scavenger (black circles) the presence of 2.5 mM TEMPOL causes rapid decays ($T_{LLS}$=11.19±0.46). The addition of 30 mM sodium ascorbate (grey circles) leads to an extension to $T_{LLS}$=17.52±0.93 (by a factor 1.6).
Figure 3B:
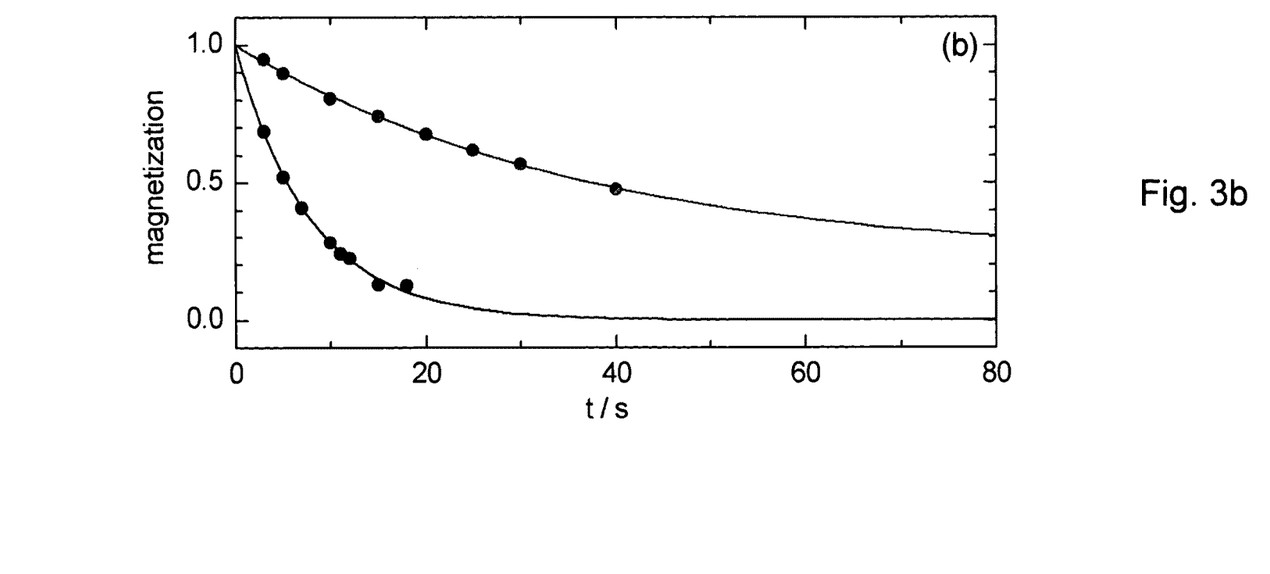
FIG. 3b Decay of long-lived states (LLS) involving the two diastereotopic H' protons of glycine in Ala-Gly, at T=296 K and $B_0$=7.05 T (300 MHz). In the absence of scavenger (black circles) the presence of 2.5 mM TEMPOL causes rapid decays (7.82±0.24 s). The addition of 30 mM sodium ascorbate (grey circles) leads to an extension to 37.4±4.4 s (factor 4.8).

The lifetimes $T_{LLS}$ of long-lived states (Carravetta, M.; Johannessen, O. G.; Levitt, M. H. *Phys. Rev. Lett.* 2004, 92, 153003-153007; Carravetta, M.; Levitt, M. H. *J. Chem. Phys.* 2005, 122, 214505; Pileio, G.; Levitt, M. H. *J. Chem. Phys.* 2009, 130, 214501; Sarkar, R.; Vasos, P. R.; Bodenhausen, G. *J. Am. Chem. Soc.* 2007, 129, 328-334; Pileio, G.; Carravetta, M.; Levitt, M. H. *Phys. Rev. Lett.* 2009, 103, 083002) (LLS) are exquisitely sensitive to paramagnetic relaxation. The scavenging of TEMPOL by sodium ascorbate leads to a dramatic extension (FIG. 3a) of the lifetimes of the LLS involving the two protons H$^I$ and H$^S$ in acrylic acid (CH$^I$H$^S$=CHCOOH). Likewise, the LLS associated with the two diastereotopic H$^\alpha$ protons in glycine in the di-peptide Ala-Gly has a significantly extended lifetime after scavenging (FIG. 3b). The LLS were excited (Sarkar, R.; Vasos, P. R.; Bodenhausen, G. *J. Am. Chem. Soc.* 2007, 129, 328-334) and sustained by CW irradiation at T=296 K and B$_0$=7.05 T, without DNP.

Figure 4A:
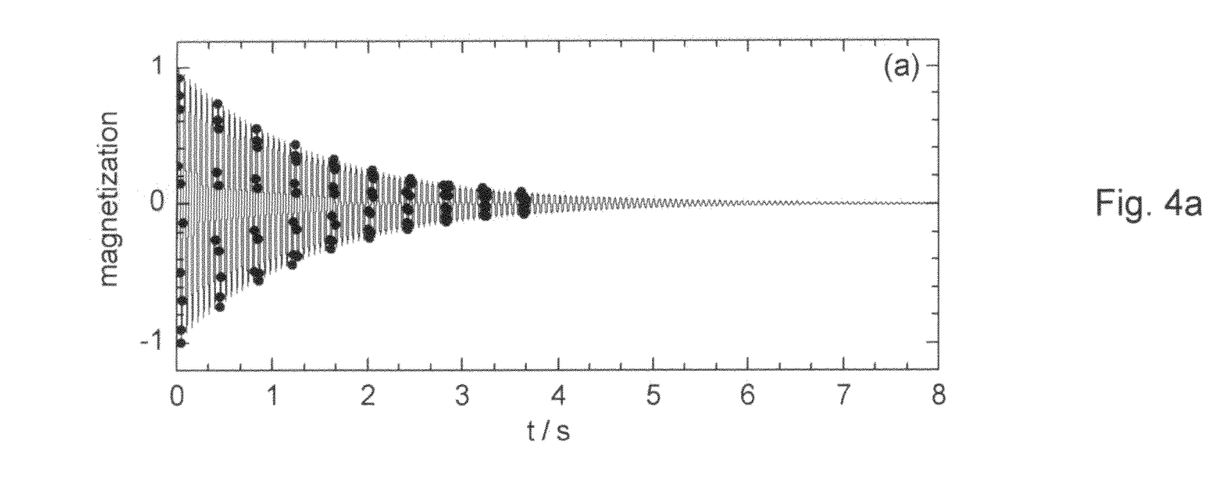
FIG. 4a The decay of the long-lived coherence (LLC) involving the two $H^\alpha$ protons of glycine in Ala-Gly is affected by the presence of 2.5 mM TEMPO ($T_{LLC}$=1. 43 s). The signal was measured at T=296 K and $B_0$=7.05 T and fitted with a mono-exponential decay multiplied by a sine function. The modulation arises from the scalar coupling constant J=17.242 Hz.
Figure 4B:
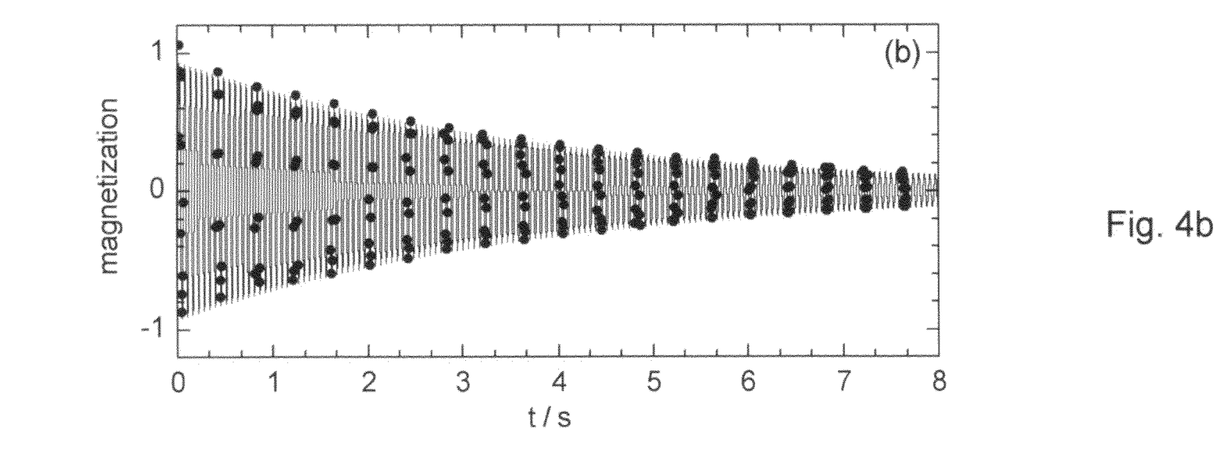
FIG. 4b After addition of 30 mM sodium ascorbate, the life-time $T_{LLC}$=3.82 s is extended by a factor 2.7. The signal was measured at T=296 K and $B_0$=7.05 T and fitted with a mono-exponential decay multiplied by a sine function. The modulation arises from the scalar coupling constant J=17.242 Hz.

Long-lived coherences (LLC) are also very sensitive to paramagnetic effects. The scavenging of TEMPOL by sodium ascorbate leads to the extension of the lifetime $T_{LLC}$ of the LLC involving the two diastereotopic H$^\alpha$ glycine protons in Ala-Gly from $T_{LLC}$=1.18 to 2.75 s (FIGS. 4a and 4b). This corresponds to a reduction in the line-width from 270 to 115 mHz. The LLC were excited and sustained by CW irradiation.

In summary, it is possible to quench paramagnetic relaxation due to the stable radicals required for dissolution DNP by mixing the frozen beads containing the substance under investigation and the stable radicals with frozen beads containing a reducing agent such as ascorbic acid (vitamin C).

REFERENCES

[1] Abragam, A.; Goldman, M. *Rep. Prog. Phys.* 1978, 41, 395-467.

[2] Comment, A.; van den Brandt, B.; Uffmann, K.; Kurdzesau, F.; Jannin, S.; Konter, J. A.; Hautle, P.; Wenckebach, W. T. H.; Gruetter, R.; van der Klink, J. J. *Concepts Magn. Reson. B* 2007, 31B, 255-269.

[3] Comment, A.; van den Brandt, B.; Uffmann, K.; Kurdzesau, F.; Jannin, S.; Konter, J. A.; Hautle, P.; Wenckebach, W. T.; Gruetter, R.; van der Klink, J. J. *Appl. Magn. Reson.* 2008, 34, 313-319.

[4] Jannin, S.; Comment, A.; Kurdzesau, F.; Konter, J. A.; Hautle, P.; van den Brandt, B.; van der Klink, J. J. *J. Chem. Phys.* 2008, 128, 241102.

[5] Ardenkjaer-Larsen, J. H.; Fridlund, B.; Gram, A.; Hansson, G.; Hansson, L.; Lerche, M. H.; Servin, R.; Thaning, M.; Golman, K. *P Natl Acad Sci USA* 2003, 100, 10158-10163.

[6] Carravetta, M.; Johannessen, O. G.; Levitt, M. H. *Phys. Rev. Lett.* 2004, 92, 153003-153007.

[7] Carravetta, M.; Levitt, M. H. *J. Chem. Phys.* 2005, 122, 214505.

[8] Pileio, G.; Levitt, M. H. *J. Chem. Phys.* 2009, 130, 214501.

[9] Sarkar, R.; Vasos, P. R.; Bodenhausen, G. *J. Am. Chem. Soc.* 2007, 129, 328-334.

[10] Pileio, G.; Carravetta, M.; Levitt, M. H. *Phys. Rev. Lett.* 2009, 103, 083002.

[11] Sarkar, R.; Comment, A.; Vasos, P. R.; Jannin, S.; Gruetter, R.; Bodenhausen, G.; Hall, H.; Kirik, D.; Denisov, V. P. *J. Am. Chem. Soc.* 2009, 131, 16014-16015.

[12] Vasos, P. R.; Comment, A.; Sarkar, R.; Ahuja, P.; Jannin, S.; Ansermet, J. P.; Konter, J. A.; Hautle, P.; van den Brandt, B.; Bodenhausen, G. P. *Natl. Acad. Sci. USA* 2009, 106, 18475-18479.

[13] Sarkar, R.; Ahuja, P.; Vasos, P. R.; Bodenhausen, G. *Chem. Phys. Chem.* 2008, 9, 2414-2419.

[14] van Heeswijk, R. B.; Uffmann, K.; Comment, A.; Kurdzesau, F.; Perazzolo, C.; Cudalbu, C.; Jannin, S.; Konter, J. A.; Hautle, P.; van den Brandt, B.; Navon, G.; van der Klink, J. J.; Gruetter, R. *Magn. Reson. Med.* 2009, 61, 1489-1493.

[15] Bardelang, D.; Banaszak, K.; Karoui, H.; Antal, R.; Waite, M.; Udachin, K.; Ripmeester, J. A.; Ratcliffe, C. I.; Ouari, O.; Tordo, P. *J. Am. Chem. Soc.* 2009, 131, 5402-5404.

[16] Warren, J. J.; Mayer, J. M. *J. Am. Chem. Soc.* 2008, 130, 7546-7547.

[17] Bielski, B. H. J.; Allen, A. O.; Schwarz, H. A. *J. Am. Chem. Soc.* 1981, 103, 3516-3518.

We claim:

1. A method for preparation of a sample, containing a solute to be investigated, for magnetic resonance (=MR) measurements using Hyperpolarization by Dissolution Dynamic Nuclear Polarization, the method comprising the steps of:
   a) preparing frozen beads of a first kind containing paramagnetic stable radicals, in addition to the solute under investigation and suitable solvents;
   b) preparing frozen beads of a second kind containing a reducing agent dissolved in a solvent;
   c) inserting the frozen beads of the first kind into a polarizing magnet;
   d) inserting the frozen beads of the second kind into the polarizing magnet together with the frozen beads of the first kind;
   e) creating enhanced polarization of nuclei within the frozen beads of the first kind in the polarizing magnet at cryogenic temperatures;
   f) heating the frozen beads of the first and second kinds, thereby obtaining a polarized mixed solution at room temperature;
   g) transferring the polarised mixed solution from the polarizing magnet to an MR magnet;
   h) reducing the paramagnetic stable radicals with the reducing agent during step g); and i) carrying out an MR measurement on the mixed solution prepared in steps a) to h), wherein steps b), d) and f) are used to quench relaxation due to paramagnetic stable radicals.

2. The method of claim 1, wherein a concentration given in mol/l of the reducing agent in the mixed solution is higher than a concentration given in mol/l of the paramagnetic stable radicals in the mixed solution.

3. The method of claim 2, wherein a concentration given in mol/l of the reducing agent in the mixed solution is higher than a concentration given in mol/l of the paramagnetic stable radicals in the mixed solution by a factor between 2 and 100.

4. The method of claim 1, wherein the reducing agent is sodium ascorbate.

5. The method of claim 1, wherein the reducing agent is dissolved in water.

6. The method of claim 5, wherein the water is deuterated.

7. The method of claim 1, wherein the paramagnetic stable radicals in the frozen beads of the first kind contain nitroxyl radicals.

8. The method of claim 1, wherein the paramagnetic stable radicals in the frozen beads of the first kind comprise 4-hydroxy-2,2,6,6-tetramethypiperidine-1-oxyl.

9. The method of claim 1, wherein the solvent of the frozen the beads of the first kind is a mixture of glycerol and water.

10. The method of claim 9, wherein the water is deuterated.

11. The method of claim 1, wherein the frozen beads of the first kind and the frozen beads of the second kind are inserted into the polarization magnet in equal masses.

12. The method of claim 1, wherein creation of enhanced polarization of nuclei within the frozen beads of the first kind in a magnetic field at cryogenic temperatures in step e) is performed by microwave irradiation.

13. The method of claim 1, wherein the MR measurement is carried out in a nuclear magnetic resonance (=NMR) spectrometer or in a magnetic resonance imaging (MRI) apparatus.

14. The method of claim 13, wherein the MRI apparatus is a tomograph.

* * * * *

UNITED STATES PATENT AND TRADEMARK OFFICE
CERTIFICATE OF CORRECTION

PATENT NO. : 8,564,288 B2
APPLICATION NO. : 12/929264
DATED : October 22, 2013
INVENTOR(S) : Sami Jannin et al.

It is certified that error appears in the above-identified patent and that said Letters Patent is hereby corrected as shown below:

On the Title Page, Item (73), correct Assignees as follows
-- Bruker BioSpin AG, Faellanden (CH);
Ecole ~~Polytechniqye~~Polytechnique Fédérale de ~~Lausanne~~
~~(EDFL)~~Lausanne (EPFL), Lausanne (CH) --.

Signed and Sealed this
Eighteenth Day of March, 2014

Michelle K. Lee
*Deputy Director of the United States Patent and Trademark Office*